United States Patent
Takahashi

(10) Patent No.: US 11,894,280 B2
(45) Date of Patent: Feb. 6, 2024

(54) SEMICONDUCTOR MODULE

(71) Applicant: FUJI ELECTRIC CO., LTD., Kawasaki (JP)

(72) Inventor: Yoshiaki Takahashi, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 291 days.

(21) Appl. No.: 17/452,072

(22) Filed: Oct. 25, 2021

(65) Prior Publication Data

US 2022/0181229 A1   Jun. 9, 2022

(30) Foreign Application Priority Data

Dec. 9, 2020 (JP) ................. 2020-204344

(51) Int. Cl.
  *H01L 23/31* (2006.01)
  *H01L 23/495* (2006.01)
  *H01L 27/07* (2006.01)
  *H01L 23/473* (2006.01)

(52) U.S. Cl.
  CPC ........ *H01L 23/3135* (2013.01); *H01L 23/473* (2013.01); *H01L 23/49513* (2013.01); *H01L 23/49541* (2013.01); *H01L 27/0727* (2013.01)

(58) Field of Classification Search
  CPC .................................................. H01L 23/3135
  USPC ......................................................... 257/666
  See application file for complete search history.

(56) References Cited

U.S. PATENT DOCUMENTS

| 2006/0220180 A1 | 10/2006 | Takahashi |
| 2016/0133798 A1* | 5/2016 | Pihale ............... C09K 11/02 257/98 |
| 2020/0294925 A1 | 9/2020 | Yamada |
| 2021/0272930 A1* | 9/2021 | Choi ............... H01L 25/105 |

FOREIGN PATENT DOCUMENTS

| JP | 2006190728 A | 7/2006 |
| JP | 2006245182 A | 9/2006 |
| JP | 2012191012 A | 10/2012 |
| WO | 2019244492 A1 | 12/2019 |

\* cited by examiner

*Primary Examiner* — Ajay Arora

(57) ABSTRACT

Provided is a semiconductor module comprising a semiconductor chip, a lead frame including a chip connection portion configured to connect the lead frame to the semiconductor chip, and a bonding member configured to connect the chip connection portion and the semiconductor chip, wherein the semiconductor chip includes a semiconductor substrate, an active portion provided on the semiconductor substrate, and a transverse protective film provided above the active portion and provided to traverse the active portion in a top view, wherein the chip connection portion includes a center portion which covers a center of the transverse protective film in a top view and a first cut-out portion provided from a first end side of the chip connection portion towards the center portion.

20 Claims, 16 Drawing Sheets

SEMICONDUCTOR MODULE

The contents of the following Japanese patent application are incorporated herein by reference:
NO. 2020-204344 filed in JP on Dec. 9, 2020.

BACKGROUND

1. Technical Field

The present invention relates to a semiconductor module.

2. Related Art

Conventionally, a semiconductor module equipped with a semiconductor chip such as an IGBT (Insulated Gate Bipolar Transistor) is known. In such a semiconductor module, a wiring member such as a lead frame and the semiconductor chip are bonded via solder which is a bonding material (see, for example, Patent Document 1-4).
Patent document 1: Japanese Patent Application Publication No. 2006-190728
Patent document 2: Japanese Patent Application Publication No. 2006-245182
Patent document 3: Japanese Patent Application Publication No. 2012-191012
Patent document 4: International Publication No. 2019-244492

SUMMARY

In a semiconductor module, scattering failure of a bonding member such as solder is preferably suppressed.

In order to solve the above-mentioned issue, one aspect of the present invention provides a semiconductor module. The semiconductor module may comprise a semiconductor chip. The semiconductor module may comprise a lead frame. The lead frame may include a chip connection portion configured to connect the lead frame to the semiconductor chip. The semiconductor module may comprise a bonding member. The bonding member may connect the chip connection portion and the semiconductor chip. The semiconductor chip may include a semiconductor substrate. The semiconductor chip may include an active portion. The active portion may be provided on the semiconductor substrate. The semiconductor chip may include a transverse protective film. The transverse protective film may be provided above the active portion. The transverse protective film may be provided to traverse the active portion in a top view. The chip connection portion may include a center portion. The center portion may cover a center of the transverse protective film in a top view. The chip connection portion may include a first cut-out portion. The first cut-out portion may be provided from a first end side of the chip connection portion towards the center portion.

The summary clause does not necessarily describe all necessary features of the embodiments of the present invention. The present invention may also be a sub-combination of the features described above.

DESCRIPTION OF EXEMPLARY EMBODIMENTS

Figure 1:
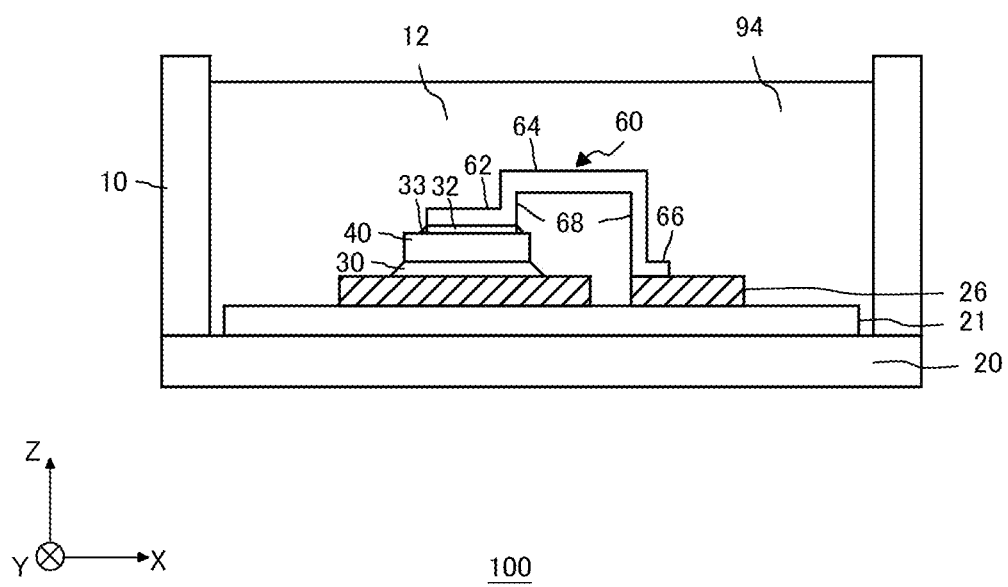
FIG. 1 illustrates an example of a semiconductor module 100 according to one embodiment of the present invention.

Hereinafter, the present invention is explained through the embodiments of the invention, but the following embodiments are not intended to limit the invention according to the claims. Further, not all the combinations of features described in the embodiments are essential for means to solve the problem in the invention. Note that, in the present specification and the drawings, repeated explanation is omitted for elements having substantially the same function or configuration by providing them with the same reference numerals, and illustration is omitted for elements that are not directly related to the present invention. In addition, elements having the same function and configuration in one figure may representatively be provided with a numeral sign, and a numeral sign may be omitted for the others.

In the present specification, one side in a direction parallel to the depth direction of the semiconductor chip is referred to as "upper" side, and the other side is referred to as "lower" side. Among the two main surfaces of a substrate, a layer, or another member, one surface is referred to as the "upper surface", and the other surface is referred to as the "lower surface". The "upper" or "lower" direction is not limited to the direction of gravity or a direction at the time of semiconductor module implementation.

In the present specification, technical matters may be described using orthogonal coordinate axes of an X axis, a Y axis, and a Z axis. The orthogonal coordinate axes merely identify relative positions of the components, and do not limit a specific direction. For example, the Z axis does not limit the height direction with respect to the ground. A +Z axis direction and a −Z axis direction are opposite to each other. When the Z axis direction is described without denoting the signs, it means that the direction is parallel to the +Z axis and the −Z axis. In the present specification, the orthogonal axis parallel to the upper surface and the lower surface of the semiconductor substrate is defined as the X axis and the Y axis. In addition, the axis perpendicular to the upper surface and the lower surface of the semiconductor substrate is defined as the Z axis. In the present specification, the direction of the Z axis may be referred to as the depth direction. In addition, in the present specification, the direction parallel to the upper surface and the lower surface of the semiconductor substrate, including the X axis and the Y axis, may be referred to as the horizontal direction.

In the present specification, the term "same" or "equal" may include a case where there is an error due to manufacturing variation or the like. The error is, for example, within 10%.

FIG. 1 illustrates an example of a semiconductor module 100 according to one embodiment of the present invention. The semiconductor module 100 may function as an electric power converter such as an inverter. The semiconductor module 100 comprises one or more insulating substrates 21. A predetermined circuit pattern 26 is provided on either one of the surfaces of the insulating substrate 21, and a cooler 20 is provided on the other surface of the insulating substrate 21. The circuit pattern 26 may be configured by bonding a copper sheet or an aluminum sheet, or a sheet plated with these materials to an insulating substrate 21 formed of silicon nitride ceramics, aluminum ceramics, or the like, by direct bonding or via a brazing material layer.

One or more semiconductor chips 40 are mounted on the circuit pattern 26. In the example of FIG. 1, one semiconductor chip 40 is mounted thereon. Solder 30 bonds the semiconductor chip 40 to the circuit pattern 26. The semiconductor chip 40 is protected by a resin package such as a resin casing 10 surrounding the insulating substrate 21 or the sealing resin 12 with which the resin casing 10 is filled. Note that, instead of providing the resin casing 10, the semiconductor chip 40 or the like may be protected by transfer molding or the like with the sealing resin 12.

The semiconductor chip 40 may include IGBT, a diode such as an FWD (free wheel diode), and an RC (reverse conducting)-IGBT which is a combination thereof, and an MOS transistor or the like. The amount of heat generation by the semiconductor chip 40 changes according to the operating state thereof. For example, in an RC-IGBT, the amount of heat generation changes since the energized site is different in a state where the IGBT is on and in a state where the IGBT is off and a current is flowing in the FWD. Thus, rise and fall in the temperature occurs in the semiconductor chip 40 at the time of switching.

The semiconductor chip 40 of the present example is a vertical-type chip in which electrodes (for example, an emitter electrode and a collector electrode) are formed on the upper surface and the lower surface thereof. The semiconductor chip 40 is connected to the circuit pattern 26 with the electrode formed on the lower surface, and connected to the wiring member with the electrode formed on the upper surface. Note that, the semiconductor chip 40 is not limited to a vertical-type chip. The semiconductor chip 40 may have an electrode connected to the circuit pattern 26 on its upper surface.

The resin casing 10 is provided to surround a space 94 accommodating the semiconductor chip 40. The cooler 20 is provided below the resin casing 10. Note that, the space 94 may be a region above the insulating substrate 21 and a region surrounded by the resin casing 10.

In the present example, the resin casing 10 is molded with resin such as a thermosetting resin that can be formed by injection molding or an ultraviolet-curing resin that can be formed by UV molding. Said resin may include one or more polymeric materials selected from, for example, polyphenylene sulfide (PPS) resin, polybutylene terephthalate (PBT) resin, polyamide (PA) resin, acrylonitrile-butadiene-styrene (ABS) resin, acrylic resin, and the like.

The cooler 20 includes a coolant such as water therein. The cooler 20 cools the semiconductor chip 40 via the insulating substrate 21 or the like. In addition, a heat releasing board may be provided between the cooler 20 and the insulating substrate 21. The cooler 20 may cool the semiconductor chip 40 via the heat releasing board.

The semiconductor chip 40 is connected to the wiring member via solder 32, of which the upper surface is a bonding member. The wiring member of the present example is a lead frame 60. The lead frame 60 is a member form of a metal material such as copper or aluminum. At least a part of the surface of the lead frame 60 may be plated with nickel or the like. In addition, at least a part of the surface of the lead frame 60 may be coated with resin or the like. The lead frame 60 may have a plate-shaped portion. Plate-shaped refers to a shape of which the area of the two main surfaces arranged facing each other is larger than the area of other surfaces. At least the portion of the lead frame 60 that connects to the semiconductor chip 40 may be plate-shaped. The lead frame 60 may be formed by bending one sheet of metal plate.

The lead frame 60 electrically connects the semiconductor chip 40 and the circuit pattern 26. A main current may flow in the lead frame 60. Here, the main current is the maximum current among the current that flows in the semiconductor chip 40. The lead frame 60 of the present example includes a chip connection portion 62, a bridging portion 64, a circuit pattern connection portion 66, and a foot portion 68. The chip connection portion 62 is a portion that is connected to the upper surface of the semiconductor chip 40. The circuit pattern connection portion 66 is a portion that is connected to the upper surface of the circuit pattern 26. The chip connection portion 62 and the circuit pattern connection portion 66 may each be a plate-shaped portion that is approximately parallel to the XY surface. Therefore, the chip connection portion 62 and the circuit pattern connection portion 66 may each be a plate-shaped portion that is approximately parallel to the upper surface of the semiconductor chip 40. Note that, approximately parallel refers to a state where the angle is 10 degrees or less, for example.

The foot portion 68 is a portion that extends in the Z axis direction. The bridging portion 64 connects the chip connection portion 62 and the circuit pattern connection portion 66 via the foot portion 68. The bridging portion 64 is arranged away from a conductive member such as the circuit pattern 26. The bridging portion 64 of the present example is arranged above the circuit pattern 26 or the like, and is provided from the chip connection portion 62 to the circuit pattern connection portion 66 to cross the circuit pattern 26 or the like.

In the present example, the sealing resin 12 is provided inside the resin casing 10. The sealing resin 12 seals the semiconductor chip 40, and the lead frame 60 which serves as a wiring member. That is, the sealing resin 12 covers the entire semiconductor chip 40 and the entire lead frame 60 so that the semiconductor chip 40 and the lead frame 60 are not exposed. The semiconductor chip 40 and the lead frame 60 can be protected by the sealing resin 12.

The solder 32 is formed between the upper surface of the semiconductor chip 40 and the lower surface of the chip connection portion 62 of the lead frame 60, and mechanically and electrically connects them. Further, the solder 32 has a fillet portion 33. The fillet portion 33 is a portion formed at the end and having a shape that is wide-based. The fillet portion 33 may be a portion of the solder 32 that does not overlap with the chip connection portion 62 in a top view (see FIG. 4). In the present example, lead-free solder is used as the solder 32. The lead-free solder may include, for example, at least any alloy among alloy formed of tin-silver-copper, alloy formed of tin-zinc-bismuth, alloy formed of tin-copper, alloy formed of tine-silver-indium-bismuth as its main component. In addition, instead of the solder 32, a metal sintered compact may be used as such a bonding member. The metal sintered compact is nickel, copper, or alloy including at least one of them.

Figure 2:
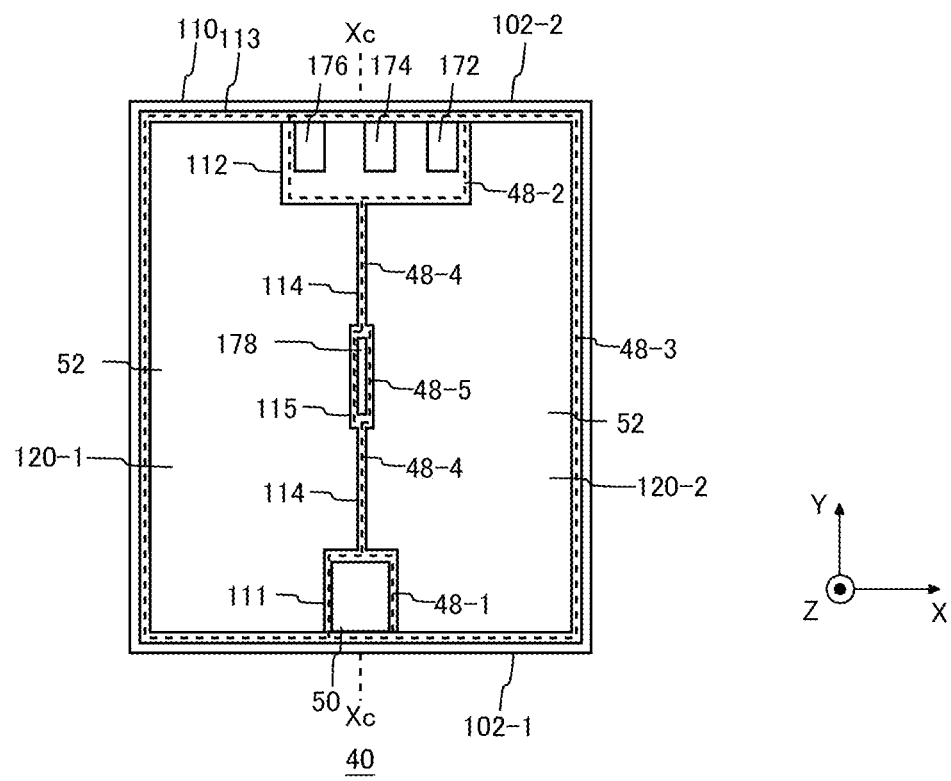
FIG. 2 illustrates an example of the arrangement of gate runners 48, well regions, and pad regions of a semiconductor chip 40 in a top view.

FIG. 2 illustrates an example of the arrangement of gate runners 48, well regions, and pad regions of the semiconductor chip 40 in a top view. The semiconductor chip 40 comprises a semiconductor substrate 110. The semiconductor substrate 110 is a substrate formed of semiconductor material such as silicon or a compound semiconductor. The semiconductor substrate 110 includes an end side 102 in a top view. The semiconductor substrate 110 of the present example includes two sets of end sides 102 facing each other in the top view. In FIG. 1, one pair of end side 102-1 and end side 102-2 facing each other is illustrated. In FIG. 1, a direction parallel to the end side 102-1 and the end side 102-2 is defined as the X axis direction, and a direction perpendicular to the end side 102-1 and the end side 102-2 is defined as the Y axis direction.

The semiconductor substrate 110 is provided with an active portion 120. In the present example, the semiconductor substrate 110 is provided with an active portion 120-1 and an active portion 120-2. The active portion 120 is a region in which the main current flows in the depth direction between the upper surface and the lower surface of the semiconductor substrate 110 when the semiconductor chip 40 is controlled to be in an on state. Therefore, the region on the inner side of the well region in FIG. 1 may be defined as the active portion 120. The active portion 120 may be provided with a transistor portion including a transistor element such as an IGBT. The active portion 120 may be provided with a diode portion including a diode element such as an FWD. The active portion 120 may be a region in which at least one of the transistor portion and the diode portion is provided. The active portion 120 may be a region which overlaps with the upper surface main electrode in a top view. The upper surface main electrode may be an electrode, among the electrodes arranged above the upper surface of the semiconductor substrate 110, having a largest area in a top view. The upper surface main electrode may be electrically connected to the emitter region or the source region of the transistor portion, for example, or may be electrically connected to the anode region of the diode portion. In the example of FIG. 2, the emitter electrode 52 is the upper surface main electrode.

The semiconductor substrate 110 is provided with a P-type well region. The well region is a P-type region having a higher concentration than the base region of the transistor portion or the anode region of the diode portion. The base region is a P-type region arranged to face the gate electrode, where a channel is formed on a portion facing the gate electrode when a predetermined gate voltage is applied to the gate electrode. The semiconductor chip 40 includes a first well region 111 and a second well region 112. The first well region 111 and the second well region 112 are arranged to sandwich the active portion 120 in a top view. The first well region 111 and the second well region 112 are arranged to sandwich the active portion 120 in a predetermined direction (the Y axis direction in FIG. 2). The two well regions sandwiching the active portion 120 refers to any straight line connecting the two well regions in a top view passing across the active portion 120.

The first well region 111 may be arranged near the end side 102-1. That is, the distance between the first well region 111 and the end side 102-1 is smaller than the distance between the first well region 111 and the end side 102-2. The second well region 112 may be arranged near the end side 102-2. That is, the distance between the second well region 112 and the end side 102-2 is smaller than the distance between the second well region 112 and the end side 102-1.

The first well region 111 of the present example is arranged between the active portion 120 and the end side 102-1 in the Y axis direction. The active portion 120 is not provided between the first well region 111 and the end side 102-1. That is, the first well region 111 is arranged between an end in the Y axis direction of the active portion 120 and the end side 102-1.

The second well region 112 of the present example is arranged between the active portion 120 and the end side 102-2 in the Y axis direction. The active portion 120 is not provided between the second well region 112 and the end side 102-2. That is, the second well region 112 is arranged between an end in the Y axis direction of the active portion 120 and the end side 102-2.

The first well region 111 and the second well region 112 may be provided in a range including the center position Xc of the end side 102-1 and the end side 102-2 in the X axis direction. The first well region 111 may be sandwiched by the active portions 120 in the X axis direction. The second well region 112 may be sandwiched by the active portions 120 in the X axis direction. The second well region 112 may be provided in a wider range in the X axis direction than the first well region 111.

The semiconductor chip 40 may include a peripheral well region 113 arranged to surround the active portion 120 in a top view. The peripheral well region 113 may be provided parallel to each end side of the semiconductor substrate 110. The peripheral well region 113 of the present example is an annular region surrounding the active portion 120 in a top view. The peripheral well region 113 may have a constant width in a direction perpendicular to each end side.

The first well region 111 and the second well region 112 of the present example protrude to the center of the active portion 120 than the peripheral well region 113. In another example, at least one of the first well region 111 and the second well region 112 may be arranged between the peripheral well region 113 and the end side 102 of the semiconductor substrate 110. In this case, the first well region 111 and the second well region 112 protrude from the peripheral well region 113 to the end side 102.

The semiconductor chip 40 may include a dividing well region 114 which divides the active portion 120 in a top view. The active portion 120 may be divided into the active portion 120-1 and the active portion 120-2 by the well region including the dividing well region 114. The dividing well region 114 has a longitudinal length in a predetermined well longitudinal direction. The dividing well region 114 extends in the well longitudinal direction to traverse the active portion 120. The well longitudinal direction of the dividing well region 114 is the Y axis direction.

The dividing well region 114 may be provided between the first well region 111 and the second well region 112. The longitudinal direction of the dividing well region 114 may have one end connected to the first well region 111 and the other end connected to the second well region 112. The dividing well region 114 may be provided in a region overlapping the center of the active portion 120.

The dividing well region 114 may include a wide portion 115 having a wider width than other portions in a direction perpendicular to the well longitudinal direction (the X axis direction in the present example) in a top view. The wide portion 115 is also provided between the first well region 111 and the second well region 112. The wide portion 115 may be provided in a region overlapping the center of the active portion 120. The wide portion 115 may be arranged in a region including the center in the well longitudinal direction of the dividing well region 114.

The semiconductor chip 40 of the present example includes control electrodes such as a gate pad 50, a current detection pad 172, an anode pad 174, and a cathode pad 176. The gate pad 50 is one example of the first pad region arranged above the first well region 111. The current detection pad 172, the anode pad 174, and the cathode pad 176 are examples of the second pad region arranged above the second well region 112.

The temperature-sensing unit 178 is a PN junction diode formed of a semiconductor material such as polysilicon. The temperature-sensing unit 178 is arranged above the wide portion 115. That is, at least a part of the temperature-sensing unit 178 and at least a part of the wide portion 115 are overlapped. Half or more of the region in a top view of the temperature-sensing unit 178 of the present example overlaps with the wide portion 115. The entire temperature-sensing unit 178 may be overlapped with the wide portion 115.

The emitter electrode 52 and each control electrode are electrodes including metal such as aluminum. An insulating film is provided between the emitter electrode 52 and each control electrode and the semiconductor substrate 110. The emitter electrode 52 and each control electrode and the semiconductor substrate 110 are connected via a contact hole provided in the insulating film. In FIG. 2, illustration of the insulating film and the contact hole are omitted.

The emitter electrode 52 is arranged above the active portion 120. The emitter electrode 52 is connected to the active portion 120 via the above-mentioned contact hole. A wiring member is connected to the upper surface of the emitter electrode 52, and a predetermined emitter voltage is applied to the upper surface of the emitter electrode 52. The emitter electrode 52 and each control electrode are provided to be separated from each other in a top view. Wire or the like is connected to the upper surface of each control electrode. The emitter electrode 52 may be provided for each of the active portion 120-1 and the active portion 120-2.

A predetermined gate voltage is applied to the gate pad 50. The gate voltage applied to the gate pad 50 is supplied to the transistor portion of the active portion 120 with a gate runner or the like, which will be described below. The gate pad 50 is arranged above the first well region 111. That is, at least a part of the gate pad 50 and at least a part of the first well region 111 are overlapped. Half or more of the region in a top view of the gate pad 50 of the present example is overlapped with the first well region 111. The entire gate pad 50 may be overlapped with the first well region 111. The gate pad 50 of the present example may be arranged near the end side 102-1 of the semiconductor chip 40. That is, the gate pad 50 is arranged between the emitter electrode 52 and the end side 102-1 of the semiconductor chip 40, and the emitter electrode 52 is not arranged between the gate pad 50 and the end side 102-1. Further, the gate pad 50 may be arranged in a region including the center position Xc in the X axis direction of the end side 102-1 of the semiconductor chip 40.

The current detection pad 172 is connected to a current detection section (not illustrated), and is configured to detect a current flowing in the current detection section. The anode pad 174 is connected to the anode region of the temperature-sensing unit 178 via wiring. The cathode pad 176 is connected to the cathode region of the temperature-sensing unit 178 via wiring. The current detection pad 172, the anode pad 174, and the cathode pad 176 are arranged above the second well region 112. For each of the control electrodes including the current detection pad 172, the anode pad 174, and the cathode pad 176, at least a part of the control electrode and at least a part of the second well region 112 are overlapped. Half or more of the region in a top view of the current detection pad 172, the anode pad 174, and the cathode pad 176 of the present example are overlapped with the second well region 112. The entire current detection pad 172, the entire anode pad 174, and the entire cathode pad 176 may be overlapped with the second well region 112. Each of the control electrodes including the current detection pad 172, the anode pad 174, and the cathode pad 176 of the present example may be arranged near the end side 102-2 of the semiconductor chip 40. That is, each of the control electrodes including the current detection pad 172, the anode pad 174, and the cathode pad 176 is arranged between the emitter electrode 52 and the end side 102-2 of the semiconductor chip 40, and the emitter electrode 52 is not arranged between each control electrode and the end side 102-2. Further, each control electrode may be arranged in a region including the center position Xc in the X axis direction of the end side 102-2 of the semiconductor chip 40. The gate pad 50 of the present example and each of the control electrodes including the current detection pad 172, the anode pad 174, and the cathode pad 176 may be arranged in each of the end sides 102-1 and 102-2 of the semiconductor chip 40 that are opposite each other. Further, they may be arranged facing each other via the dividing well region 114.

In FIG. 2, the gate runners 48 are illustrated with broken lines. The gate runners 48 are wiring formed of polysilicon to which impurities are added, or a conductive material such as metal. The gate runners 48 supplies the gate voltage applied to the gate pad 50 to the transistor portion provided on the active portions 120. The gate runners 48 may be arranged above the well region.

The semiconductor chip 40 may include a gate runner 48-3 arranged to surround the active portion 120 in a top view. The gate runner 48-3 may be arranged above the peripheral well region 113.

The semiconductor chip 40 may include a gate runner 48-1 surrounding at least some region of the first well region 111 in a top view. The gate runner 48-1 may be arranged along an end side of the first well region 111 in a top view. The gate runner 48-1 may include a portion that is parallel to each end side of the first well region 111.

The semiconductor chip 40 may include a gate runner 48-2 surrounding at least some region of the second well region 112 in a top view. The gate runner 48-2 may be arranged along an end side of the second well region 112 in a top view. The gate runner 48-2 may include a portion that is parallel to each end side of the second well region 112.

The semiconductor chip 40 may include a gate runner 48-4 arranged above the dividing well region 114 in a top view. The semiconductor chip 40 may include a gate runner 48-5 surrounding at least some region of the wide portion 115 in a top view. The gate runner 48-5 may be arranged along an end side of the wide portion 115 in a top view. The gate runner 48-5 may include a portion that is parallel to each end side of the wide portion 115. The gate runner 48-4 and the gate runner 48-5 may divide the active portion 120 in a top view.

The semiconductor chip 40 may comprise an edge termination structure portion between the peripheral well region 113 and an end side of the semiconductor substrate 110. The edge termination structure portion relaxes electric field strength on the upper surface side of the semiconductor substrate 110. The edge termination structure portion is structured by, for example, a guard ring provided in an annular shape surrounding the active portion 120, a field plate, a RESURF, and a combination thereof.

Figure 3:
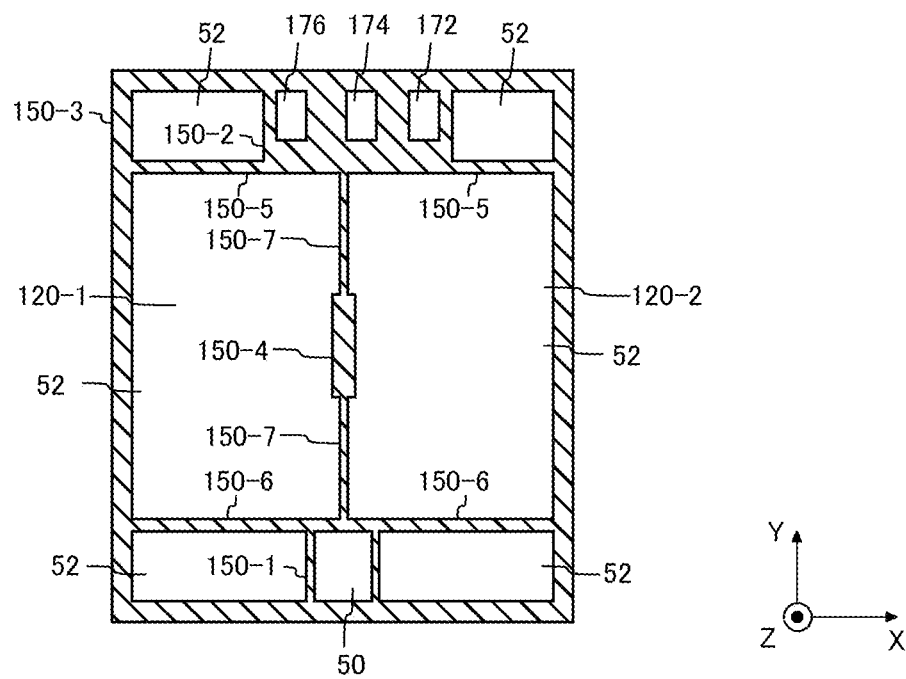
FIG. 3 illustrates an example of the arrangement of protective films 150 of the semiconductor chip 40 in a top view.

FIG. 3 illustrates an example of the arrangement of protective films 150 of the semiconductor chip 40 in a top view. In FIG. 3, the region in which the protective films 150 are arranged is illustrated with a hatched part by oblique lines. The protective films 150 may be provided above the emitter electrode 52 and above the semiconductor substrate 110. The protective films 150 may be in contact with the upper surface emitter electrode 52. By providing the protective films 150, the upper surface of the semiconductor chip 40 can be protected. The protective films 150 are polyimide films, as an example.

The semiconductor chip 40 may include a protective film 150-1 that covers the first well region 111. The protective film 150-1 may expose a part of the upper surface of the gate pad 50. In this way, a wire or the like can be connected to the upper surface of the gate pad 50.

The semiconductor chip 40 may include a protective film 150-2 that covers the second well region 112. The protective film 150-2 may expose a part of the upper surfaces of the current detection pad 172, the anode pad 174, and the cathode pad 176. In this way, a wire or the like can be connected to the upper surfaces of the current detection pad 172, the anode pad 174, and the cathode pad 176.

The semiconductor chip 40 may include a protective film 150-3 that covers the peripheral well region 113. The protective film 150-3 may cover the entire peripheral well region 113. The protective film 150-3 is one example of a peripheral protective film. The semiconductor chip 40 may include a protective film 150-4 and a protective film 150-7 that cover the dividing well region 114. The protective film 150-4 and the protective film 150-7 may cover the entire dividing well region 114. In the present example, the protective film 150-4 covers the entire wide portion 115, and the protective film 150-7 cover the entire dividing well region 114 other than the wide portion 115. The protective film 150-4 and the protective film 150-7 are examples of a transverse protective film.

The protective films 150 expose a part of the upper surface of the emitter electrode 52. In this way, a wire or the like can be easily connected to the upper surface of the emitter electrode 52.

The semiconductor chip 40 may include a protective film 150-5 and a protective film 150-6 that divides the upper surface of the semiconductor substrate 110

The protective film 150-5 and the protective film 150-6 may be provided to traverse the upper surface of the semiconductor substrate 110 in the X axis direction.

Figure 4:
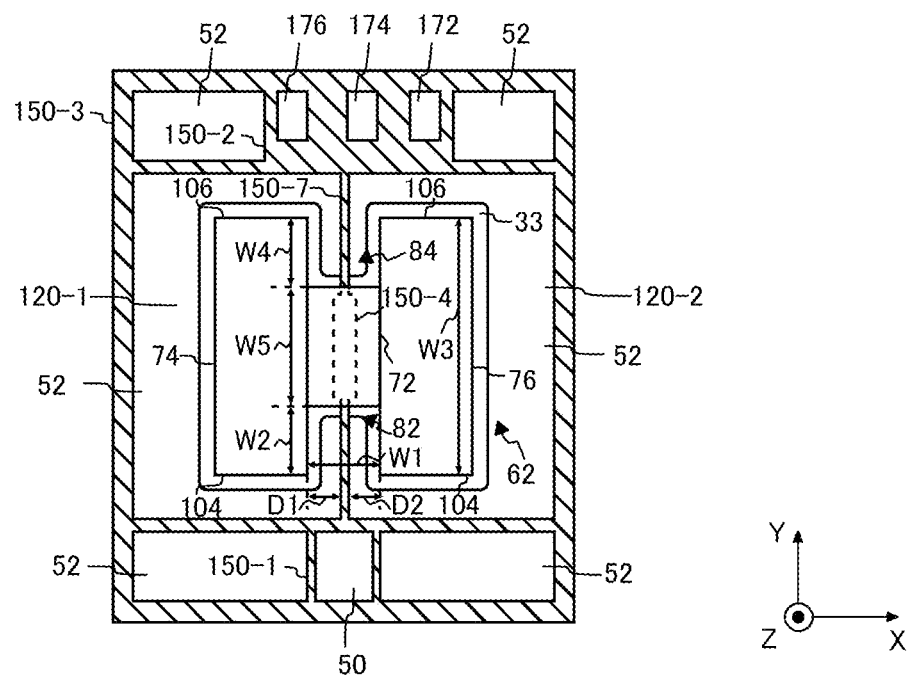
FIG. 4 illustrates an example of the arrangement of the semiconductor chip 40, solder 32, and a chip connection portion 62 in a top view.

FIG. 4 illustrates an example of the arrangement of the semiconductor chip 40, solder 32, and a chip connection portion 62 in a top view. In FIG. 4, an example of the arrangement of the solder 32 (the fillet portion 33 in FIG. 4) and the chip connection portion 62 of the lead frame 60 in the semiconductor chip 40 is illustrated. In FIG. 4, the protective films 150 that overlap with the chip connection portion 62 are illustrated with dotted lines.

The chip connection portion 62 has end sides in a top view. The chip connection portion 62 of the present example has two sets of end sides facing each other in a top view. One end side is a side that is arranged on the same straight line in a top view. In FIG. 4, one pair of the first end side 104 and the second end side 106 facing each other is illustrated. The first end side 104 of the chip connection portion 62 faces the gate pad 50. The first end side 104 is the end side closest to the gate pad 50 among the end sides of the chip connection portion 62. The second end side 106 of the chip connection portion 62 faces the current detection pad 172, the anode pad 174, and the cathode pad 176. The second end side 106 is an end side that is on the opposite side of the first end side 104. The second end side 106 may be the end side that is closest to any of the current detection pad 172, the anode pad 174, and the cathode pad 176, among the end sides of the chip connection portion 62.

In a case where the lead frame 60 is connected to the semiconductor chip 40 via the solder 32, parts of the protective film 150-4 and the protective film 150-7 and the chip connection portion 62 of the lead frame 60 come into contact. In a case where a non-metal material such as a polyimide film is used for the protective films 150, voids formed of air or the like is generated between the protective films 150 and the chip connection portion 62 since solder wettability of the protective films 150 is low. When voids are present between the protective films 150 and the chip connection portion 62, solder scattering occurs in a case where decompression processing is performed at the heat treatment apparatus or the like. When solder is scattered on the control electrode, the reliability of connection between the control electrode and the wire or the like is reduced. In addition, the pad region and the emitter electrode 52 may become connected due to solder scattering.

In the present example, the chip connection portion 62 includes a center portion 72 and a first cut-out portion 82. The center portion 72 covers the center of the transverse protective film in a top view. In the present example, the center of the transverse protective film refers to the center in the Y axis direction. In the present example, the center portion 72 covers the entire protective film 150-4. The first cut-out portion 82 is provided from the first end side 104 of the chip connection portion towards the center portion 72. That is, the center of the transverse protective film is included in a region obtained by extending the first cut-out portion 82 in a top view. Portions of the chip connection portion 62 that come into contact with the transverse protective film can be reduced since the chip connection portion 62 has the center portion 72 and the first cut-out portion 82. Therefore, the generation of voids between the protective films 150 and the chip connection portion 62 can be reduced, and scattering failure of a bonding member such as solder can be suppressed. In addition, in a case where scattering of a bonding member such as solder occurs, the failure of the gate pad 50 and the emitter electrode 52 being connected becomes less likely to occur since the distance between an end of the center portion 72 and the gate pad 50 becomes large.

The first cut-out portion 82 may be provided along an extending direction of the transverse protective film. In addition, the first cut-out portion 82 may be provided above the transverse protective film. In the present example, the first cut-out portion 82 is provided along the extending direction of the protective film 150-7. The extending direction of the protective film 150-7 is the Y axis direction. In addition, in the present example, the first cut-out portion 82 is provided above the protective film 150-7. Since the first cut-out portion 82 is provided along the transverse protective film, failure due to scattering of a bonding member such as solder can be reduced.

The chip connection portion may include a second cut-out portion 84 from the second end side 106 that is different from the first end side 104 towards the center portion 72. That is, the center of the transverse protective film is included in a region obtained by extending the second cut-out portion 84 in a top view. The second cut-out portion 84 of the present example is provided on the second end side 106 that is on the opposite side of the first end side 104. In this case, the center portion 72 is a portion that is sandwiched by the first cut-out portion 82 and the second cut-out portion 84. In another example, the second cut-out portion 84 may be provided on an end side other than the first end side 104 and the second end side 106. For example, the second cut-out portion 84 may be provided on an end side perpendicular to the first end side 104. Portions of the chip connection portion 62 that come into contact with the transverse protective film can be reduced since the chip connection portion 62 has the center portion 72 and the second cut-out portion 84. Therefore, the generation of voids between the protective films 150 and the chip connection portion 62 can be reduced, and scattering failure of a bonding member such as solder can be suppressed. In addition, even in a case where scattering of a bonding member such as solder occurs, since the distance between the end of the center portion 72 and the current detection pad 172, the anode pad 174, or the cathode pad 176 becomes large, solder can be suppressed from scattering to near these control electrodes. Thus, reliability of connection between these control electrodes and the wire can be maintained, and also, the failure of the current detection pad 172, the anode pad 174, or the cathode pad 176 connecting to the emitter electrode 52 becomes less likely to occur.

The width W1 of the first cut-out portion 82 in the X axis direction may be 1.0 mm or larger. The width W1 of the first cut-out portion 82 in the X axis direction may be 1.5 mm or larger. In addition, the width W2 of the first cut-out portion 82 in the Y axis direction may be 1.0 mm or larger. The width W2 of the first cut-out portion 82 in the Y axis direction may be 1.5 mm or larger. The second cut-out portion 84 may have the same shape as the first cut-out portion 82 in a top view. In addition, the second cut-out portion 84 may have a different shape from the first cut-out portion 82 in a top view. In the present example, the first cut-out portion 82 and the second cut-out portion 84 have rectangular shapes in a top view.

The center portion 72 preferably covers the center of the active portion 120. In addition, the temperature-sensing unit 178 is preferably arranged in the center for temperature measurement. Therefore, the center portion 72 preferably covers the temperature-sensing unit 178. The center portion 72 covers the center of the active portion 120, thereby enabling the failure due to scattering of a bonding member such as solder to be reduced, in either case where scattering of the bonding member such as solder occurs in the first cut-out portion 82 or the second cut-out portion 84.

The chip connection portion 62 may include a first portion 74 and a second portion 76 arranged to sandwich the first cut-out portion 82 and the center portion 72 in a top view. The first cut-out portion 82 and the center portion 72 of the present example are sandwiched by the first portion 74 and the second portion 76 in the X axis direction. A line obtained by extending the boundary between the first cut-out portion 82 and the first portion 74 in the Y axis direction may be defined as the boundary between the first portion 74 and the center portion 72. Similarly, a line obtained by extending the boundary between the first cut-out portion 82 and the second portion 76 in the Y axis direction may be defined as the boundary between the second portion 76 and the center portion 72. In the present example, the first portion 74 and the second portion 76 also sandwiches the second cut-out portion 84.

The fillet portion 33 is a portion of the solder 32 that protrudes outside the chip connection portion 62. The fillet portion 33 in FIG. 4 is arranged to extend outside the chip connection portion 62 in a top view. In the top view, the shortest distance between the protective film 150-7 and the first portion 74 may be longer than the extending length of the fillet portion 33. The extending length of the fillet portion 33 refers to the extending length in a direction perpendicular to the end side of the chip connection portion 62. In addition, the shortest distance between the protective film 150-7 and the second portion 76 may be longer than the extending length of the fillet portion 33. By setting the shortest distance between the first portion 74 or the second portion 76 and the transverse protective film to be longer than the extending length of the fillet portion 33, the solder 32 can be prevented from coming into contact with the transverse protective film. As one example, the shortest distance D1 between the protective film 150-7 and the first portion 74 is 0.5 mm or longer. In addition, as one example, the shortest distance D2 between the protective film 150-7 and the second portion 76 is 0.5 mm or longer.

In the top view, the distance between the protective film 150-3 and the first portion 74 may be longer than the extending length of the fillet portion 33. In addition, the distance between the protective film 150-3 and the second portion 76 may be longer than the extending length of the fillet portion 33.

The width W2 of the first cut-out portion 82 in the Y axis direction may be 10% or more, may be 20% or more, or may be 30% or more of the width W3 of the chip connection portion 62 in the Y axis direction. By setting the width W2 of the first cut-out portion 82 in the Y axis direction to be larger, a portion where the transverse protective film and the chip connection portion 62 overlaps can be reduced. The width W4 of the second cut-out portion 84 in the Y axis direction may be 10% or more, may be 20% or more, or may be 30% or more of the width W3 of the chip connection portion 62 in the Y axis direction. The width W5 of the center portion 72 in the Y axis direction may be 30% or more, may be 40% or more, or may be 50% or more of the width W3 of the chip connection portion 62 in the Y axis direction. By ensuring the width W5 of the center portion 72, the electrical resistance between the first portion 74 and the second portion 76 can be reduced. Note that, the width W3 is the total width of the width W2, the width W4, and the width W5.

Figure 5:
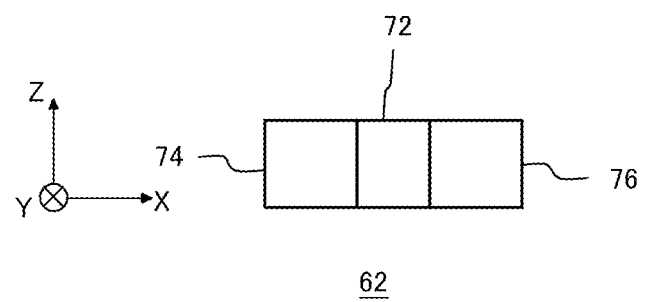
FIG. 5 illustrates an example of the chip connection portion 62 in FIG. 4 in a side view.

FIG. 5 illustrates an example of the chip connection portion 62 in FIG. 4 in a side view. In the present example, the thicknesses of the center portion 72, the first portion 74, and the second portion 76 are respectively equal.

Figure 6:
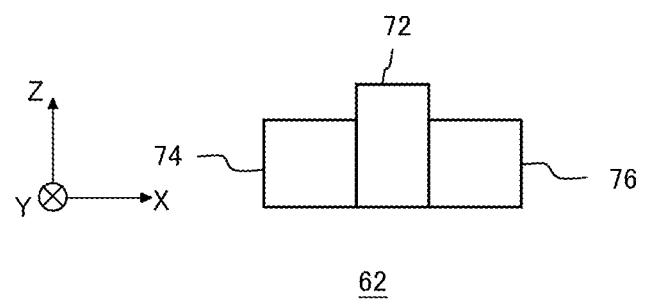
FIG. 6 illustrates another example of the chip connection portion 62 in FIG. 4 in a side view.

FIG. 6 illustrates another example of the chip connection portion 62 in FIG. 4 in a side view. In the present example, the center portion 72 is thicker compared to the first portion 74 and the second portion 76 in the height direction (the Z axis direction). Current crowding is likely to occur in the center portion 72. Therefore, by thickening the center portion 72, the resistance of the center portion 72 is lowered and the rise in the temperature due to current crowding can be suppressed. In a case where the center portion 72 is thicker compared to the first portion 74 and the second portion 76, the chip connection portion 62 is preferably fabricated by forging. The center portion 72 may be more than twice as thick as the first portion 74 and the second portion 76.

Figure 7:
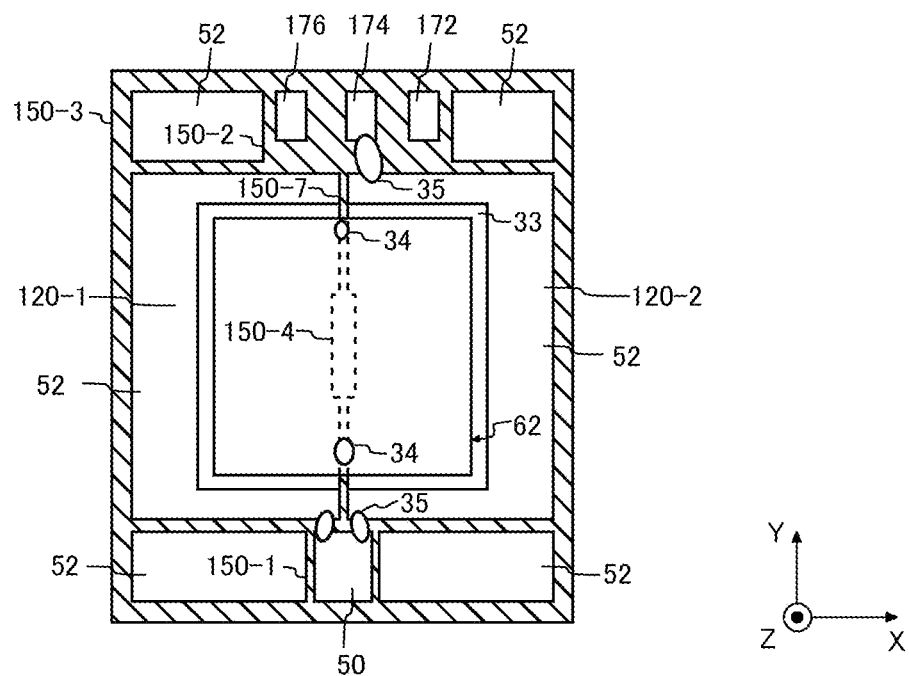
FIG. 7 illustrates an example of the arrangement of the semiconductor chip 40, the solder 32, and the chip connection portion 62 according to a comparative example.

FIG. 7 illustrates an example of the arrangement of the semiconductor chip 40, the solder 32, and the chip connection portion 62 according to a comparative example. In the present example, the chip connection portion 62 does not include a cut-out portion. Therefore, voids 34 are generated between the protective films 150 and the chip connection portion 62. When decompression processing is performed at the heat treatment apparatus with the voids 34 being present between the protective films 150 and the chip connection portion 62, the voids 34 disrupt and solder scattering 35 occurs. When the pad region and the emitter electrode 52 are connected due to the solder scattering 35, a failure occurs. In the present example, the gate pad 50 and the emitter electrode 52 are connected through the solder scattering 35. In addition, the anode pad 174 and the emitter electrode 52 are connected through the solder scattering 35.

Figure 8:
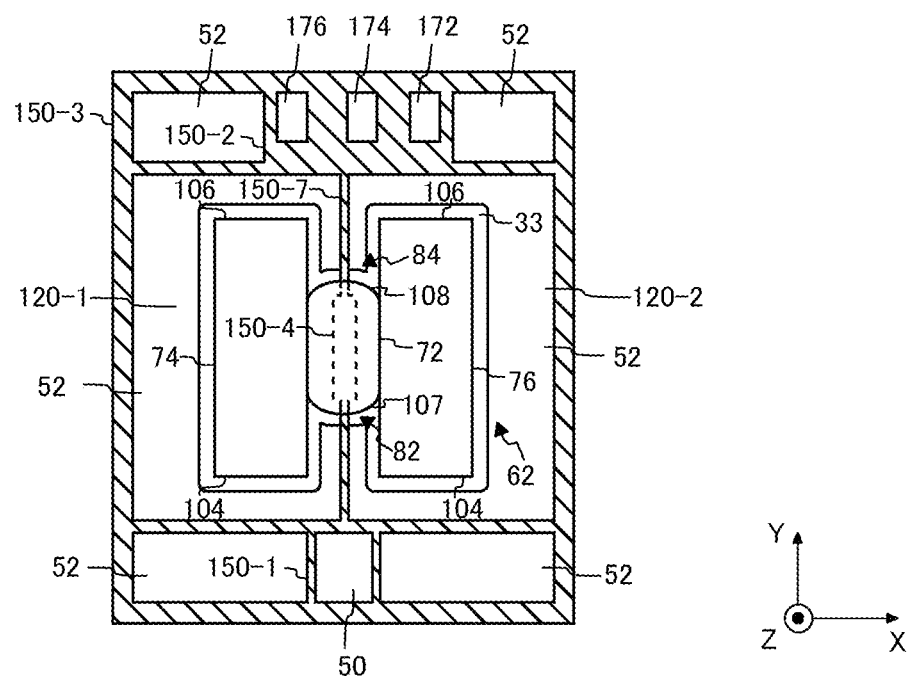
FIG. 8 illustrates another example of the arrangement of the semiconductor chip 40, the solder 32, and the chip connection portion 62 in a top view.

FIG. 8 illustrates another example of the arrangement of the semiconductor chip 40, the solder 32, and the chip connection portion 62 in a top view. The configuration of the center portion 72 in FIG. 8 is different from that in FIG. 4. The configuration of other components in FIG. 8 may be the same as that in FIG. 4.

The end 107 of the center portion 72 facing the first cut-out portion 82 may have an inclination with respect to a direction perpendicular to an extending direction of the transverse protective film. In the present example, the end 107 of the center portion 72 facing the first cut-out portion 82 may have an inclination with respect to the X axis direction. In FIG. 8, the end 107 has an arc. In addition, in the present example, the end 108 of the center portion 72 facing the second cut-out portion 84 has an inclination with respect to the X axis direction. In FIG. 8, the end 108 has an arc. Since the cut-out portion has an inclination with respect to a direction perpendicular to the extending direction of the transverse protective film, the end side of the fillet portion 33 is shaped along the cut-out portion. Since the solder is likely to scatter in a direction perpendicular the end side of the fillet portion 33, the direction of the solder scattering 35 can be changed to further reduce the failure due to the solder scattering 35.

Figure 9:
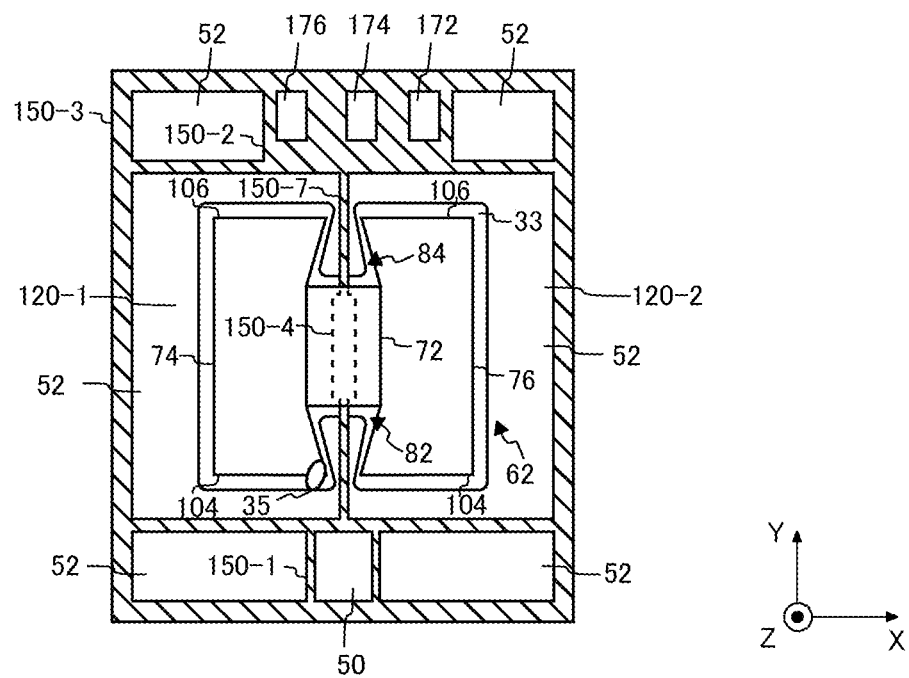
FIG. 9 illustrates another example of the arrangement of the semiconductor chip 40, the solder 32, and the chip connection portion 62 in a top view.

FIG. 9 illustrates another example of the arrangement of the semiconductor chip 40, the solder 32, and the chip connection portion 62 in a top view. The configuration of the first cut-out portion 82 and the second cut-out portion 84 in FIG. 9 is different from that in FIG. 4. The configuration of other components in FIG. 9 may be the same as that in FIG. 4.

The first cut-out portion 82 may have a tapered shape in a top view. That is, the width of the first cut-out portion 82 in the X axis direction may become smaller towards the gate pad 50. In addition, the second cut-out portion 84 may have a tapered shape in a top view. That is, the width of the second cut-out portion 84 in the X axis direction may become smaller towards the current detection pad 172, the anode pad 174, and the cathode pad 176. Since the cut-out portions have tapered shapes, the solder scattering from the center portion 72 is likely to be blocked by the first portion 74 or the second portion 76. Thus, even in a case where the solder scattering 35 occurs, the solder can be prevented from reaching the pad region, and the failure due to the solder scattering 35 can be reduced.

Figure 10:
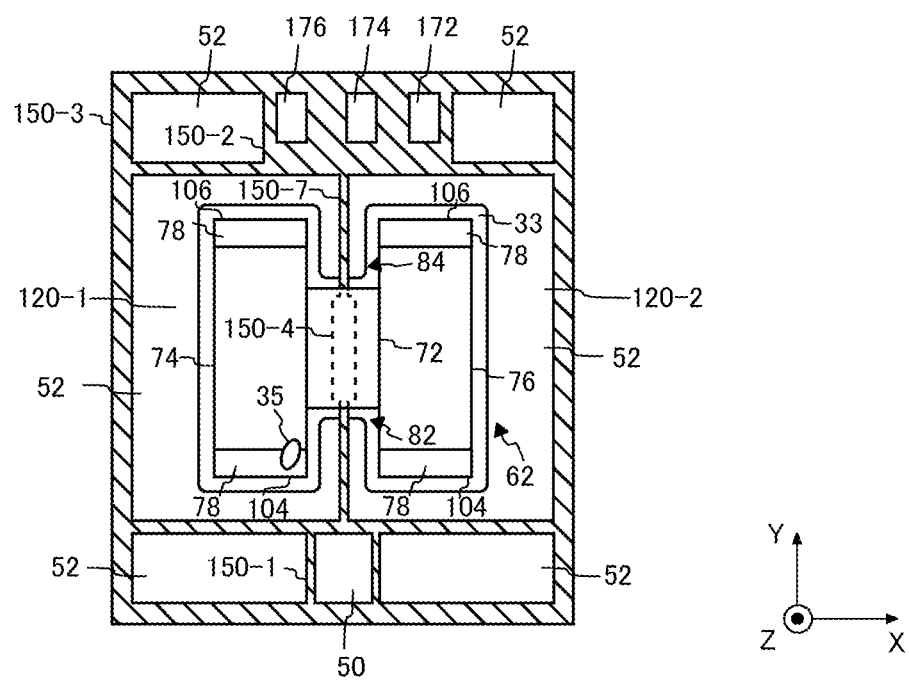
FIG. 10 illustrates another example of the arrangement of the semiconductor chip 40, the solder 32, and the chip connection portion 62 in a top view.

FIG. 10 illustrates another example of the arrangement of the semiconductor chip 40, the solder 32, and the chip connection portion 62 in a top view. The configuration of the first portion 74 and the second portion 76 in FIG. 10 is different from that in FIG. 4. The configuration of other components in FIG. 10 may the same as that in FIG. 4.

The first portion 74 may include an extending portion 78 which extends in a height direction (the Z axis direction) between the center portion 72 and the first end side 104 in a top view. A part of the extending portion 78 may be arranged between the center portion 72 and the first end side 104, or the entire extending portion 78 may be arranged between the center portion 72 and the first end side 104. Extending in the height direction refers to the position of the tip of the extending portion 78 in the Z axis direction being away from the upper surface of the semiconductor chip 40, compared to other regions of the first portion 74. The upper end of the extending portion 78 may be arranged at the highest location in the first portion 74. In addition, the second portion 76 may include an extending portion 78 which extends in the height direction between the center portion 72 and the second end side 106. In the present example, the first portion 74 includes the extending portions 78 in each of the ends in the Y axis direction. The second portion 76 may include an extending portion 78 which extends in the height direction between the center portion 72 and the first end side 104. The second portion 76 may include an extending portion 78 which extends in the height direction between the center portion 72 and the second end side 106. In the present example, the second portion 76 includes extending portions 78 in each of the ends in the Y axis direction. By including the extending portion 78, the solder can be prevented from reaching the pad region even in a case where the solder scattering 35 occurs, and failure due to the solder scattering 35 can be reduced.

Figure 11:
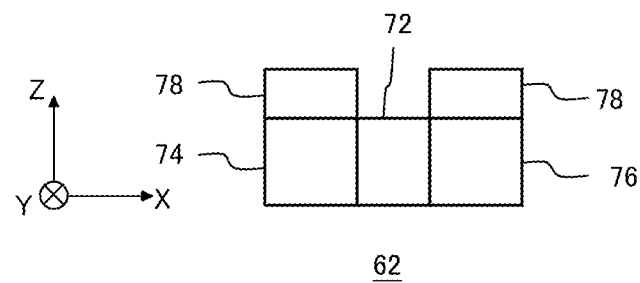
FIG. 11 illustrates an example of the chip connection portion 62 in FIG. 10 in a side view.

FIG. 11 illustrates an example of the chip connection portion 62 in FIG. 10 in a side view. In the present example, the extending portion 78 extends in the height direction (the Z axis direction). Since the extending portion 78 extends in the height direction, failure due to solder scattering 35 can be reduced. In addition, in the present example, the thickness of the center portion 72 is set to be the same as that of the first portion 74 and the second portion 76, but the center portion 72 may be thicker compared to the first portion 74 and the second portion 76. The thickness of the center portion 72 may be thicker than the total thickness of the first portion 74 and the extending portion 78.

Figure 12:
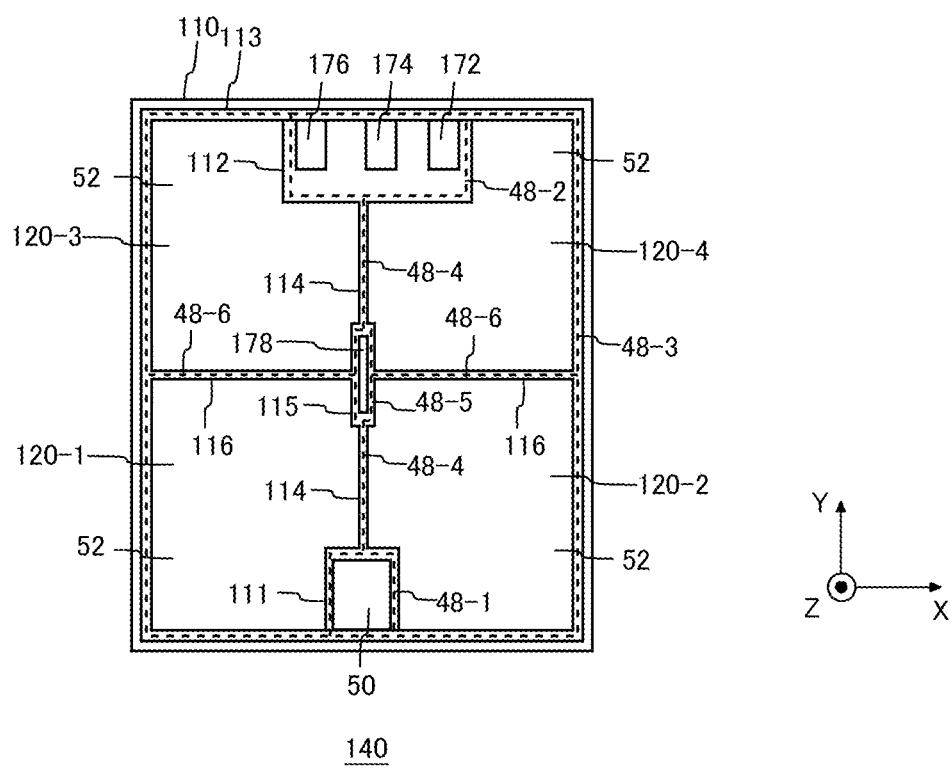
FIG. 12 illustrates an example of the arrangement of the gate runners 48, the well regions, and the pad regions of the semiconductor chip 140 in a top view.

FIG. 12 illustrates an example of the arrangement of the gate runners 48, the well regions, and the pad regions of the semiconductor chip 140 in a top view. The semiconductor chip 140 in FIG. 12 is different from the semiconductor chip 40 in FIG. 2 in that it includes a dividing well region 116 and a gate runner 48-6. The configuration of other components of the semiconductor chip 140 in FIG. 12 may be the same as that of the semiconductor chip 40 in FIG. 2.

The semiconductor chip 40 may include a dividing well region 116 which divides the active portion 120 in a top view. The active portion 120 may be divided into the active portion 120-1, the active portion 120-2, the active portion 120-3, and the active portion 120-4 by the well region including the dividing well region 114 and the well region including the dividing well region 116. The dividing well region 116 has a longitudinal length in a predetermined well longitudinal direction. The dividing well region 116 extends in the well longitudinal direction to traverse the active portion 120. The well longitudinal direction of the dividing well region 116 is the X axis direction. One end of the longitudinal direction of the dividing well region 116 may be connected to an end of the peripheral well region 113, and the other end may be connected to another end of the peripheral well region 113. The dividing well region 116 may intersect the dividing well region 114 in the wide portion 115.

The semiconductor chip 40 may include the gate runner 48-6 arranged above the dividing well region 116 in a top view. The gate runner 48-4, the gate runner 48-5, and the gate runner 48-6 may divide the active portion 120 in a top view.

Figure 13:
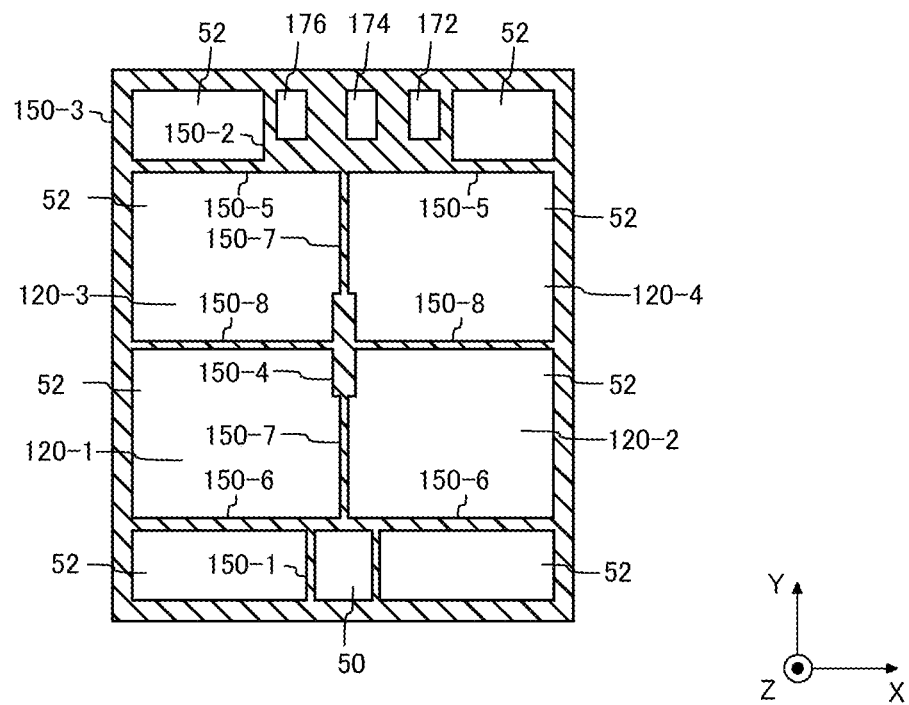
FIG. 13 illustrates an example of the arrangement of the protective films 150 of the semiconductor chip 140 in a top view.

FIG. 13 illustrates an example of the arrangement of the protective films 150 of the semiconductor chip 140 in a top view. The semiconductor chip 140 in FIG. 13 is different from the semiconductor chip 40 in FIG. 3 in that it includes a protective film 150-8. The configuration of other components of the semiconductor chip 140 in FIG. 13 may be the same as that of the semiconductor chip 40 in FIG. 3.

The semiconductor chip 140 may include the protective film 150-8 which covers the dividing well region 116. The entire dividing well region 116 may be covered by the protective film 150-8. The protective film 150-8 is one example of the transverse protective film. That is, the semiconductor chip 140 includes a plurality of transverse protective films.

Figure 14:
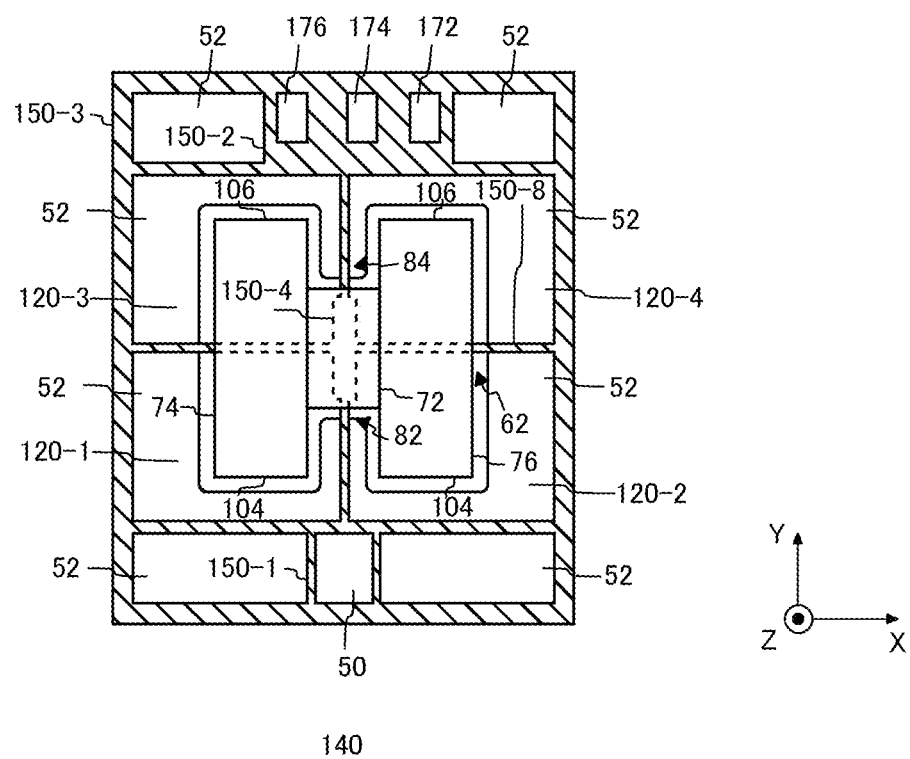
FIG. 14 illustrates an example of the arrangement of the semiconductor chip 140, the solder 32, and the chip connection portion 62 in a top view.

FIG. 14 illustrates an example of the arrangement of the semiconductor chip 140, the solder 32, and the chip connection portion 62 in a top view. The semiconductor chip 140 in FIG. 14 is different from the semiconductor chip 40 in FIG. 4 in that it includes a protective film 150-8. The configuration of other components of the semiconductor chip 140 in FIG. 14 may be the same as that of the semiconductor chip 40 in FIG. 4.

In the present example, a cut-out portion is provided only on the end side of the chip connection portion 62 facing the first pad region or the second pad region. That is, cut-out portions are only provided on the first end side 104 facing the gate pad 50, and the second end side 106 facing the current detection pad 172, the anode pad 174, and the cathode pad 176, and a cut-out portion is not provided on the other end sides of the chip connection portion 62. Failure of the pad region connecting to the emitter electrode 52 does not occur even when solder scattering occurs at an end side that does not face the pad region. Therefore, by such configuration, the area of the chip connection portion 62 can be enlarged, and bonding failure between the chip connection portion 62 and the semiconductor chip 40 can be reduced.

Figure 15:
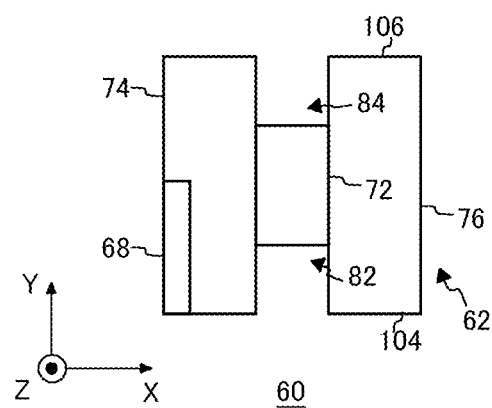
FIG. 15 illustrates an example of the arrangement of a foot portion 68 of a lead frame 60 in a top view.

FIG. 15 illustrates an example of the arrangement of a foot portion 68 of a lead frame 60 in a top view. In FIG. 15, illustration of the configuration of the components of the lead frame 60 other than the foot portion 68 which connects to the chip connection portion 62 and the chip connection portion 62 is omitted. The bridging portion 64 may be connected to one of the first portion 74 and the second portion 76. In the present example, the foot portion 68 is provided in the first portion 74, and the bridging portion 64 is connected to the first portion 74. The longitudinal direction of the foot portion 68 may be parallel to a direction in which the first cut-out portion 82 extends from the first end side 104 towards the center portion 72. In the present example, the longitudinal direction of the foot portion 68 is the Y axis direction. In the present example, a direction in which the first cut-out portion 82 extends from the first end side 104 towards the center portion 72 is the Y axis direction.

Figure 16:
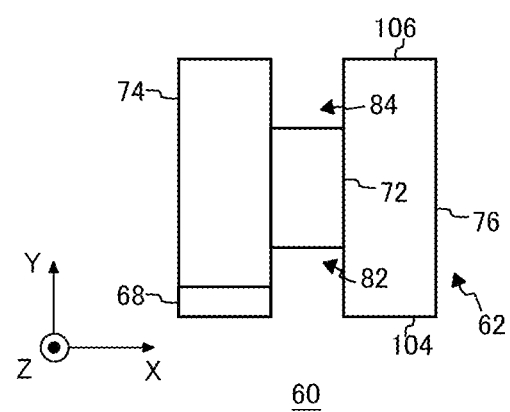
FIG. 16 illustrates another example of the arrangement of the foot portion 68 of the lead frame 60 in a top view.

FIG. 16 illustrates another example of the arrangement of the foot portion 68 of the lead frame 60 in a top view. In FIG. 16, similarly to FIG. 15, illustration of the configuration of the components of the lead frame 60 other than the foot portion 68 which connects to the chip connection portion 62 and the chip connection portion 62 is omitted. The foot portion 68 may be provided in the first portion 74. The longitudinal direction of the foot portion 68 may be perpendicular to a direction in which the first cut-out portion 82 extends from the first end side 104 towards the center portion 72. In the present example, the longitudinal direction of the foot portion 68 is the X axis direction. In the present example, a direction in which the first cut-out portion 82 extends from the first end side 104 towards the center portion 72 is the Y axis direction. In addition, in a case where the chip connection portion 62 includes the extending portion 78 described in FIG. 10 and FIG. 11, the foot portion 68 may be connected to the extending portion 78.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor module comprising:
   a semiconductor chip;
   a lead frame including a chip connection portion configured to connect the lead frame to the semiconductor chip; and
   a bonding member configured to connect the chip connection portion and the semiconductor chip;
   wherein the semiconductor chip includes:
   a semiconductor substrate;
   an active portion provided on the semiconductor substrate; and
   a transverse protective film provided above the active portion and provided to traverse the active portion in a top view:
   wherein the chip connection portion includes:
   a center portion which covers a center of the transverse protective film in a top view; and
   a first cut-out portion provided from a first end side of the chip connection portion towards the center portion.

2. The semiconductor module according to claim 1, wherein
   the center portion covers a center of the active portion.

3. The semiconductor module according to claim 1,
   wherein the first cut-out portion is provided along an extending direction of the transverse protective film and above the transverse protective film.

4. The semiconductor module according to claim 2,
   wherein the first cut-out portion is provided along an extending direction of the transverse protective film and above the transverse protective film.

5. The semiconductor module according to claim 1, wherein the semiconductor chip further includes a temperature-sensing unit arranged above the semiconductor substrate, and the center portion covers the temperature-sensing unit.

6. The semiconductor module according to claim 2, wherein the semiconductor chip further includes a temperature-sensing unit arranged above the semiconductor substrate, and the center portion covers the temperature-sensing unit.

7. The semiconductor module according to claim 1, wherein, the semiconductor chip further includes a first pad region provided on the semiconductor substrate, and the first end side of the chip connection portion faces the first pad region.

8. The semiconductor module according to claim 2, wherein, the semiconductor chip further includes a first pad region provided on the semiconductor substrate, and the first end side of the chip connection portion faces the first pad region.

9. The semiconductor module according to claim 7, wherein, the chip connection portion further includes a second cut-out portion provided from a second end side that is different from the first end side towards the center portion.

10. The semiconductor module according to claim 9, wherein, the first end side and the second end side are end sides that are opposite each other.

11. The semiconductor module according to claim 10, wherein, the semiconductor chip further includes a second pad region arranged to sandwich the active portion with the first pad region, and the second end side of the chip connection portion faces the second pad region.

12. The semiconductor module according to claim 1, wherein the chip connection portion includes a first portion and a second portion which are arranged to sandwich the first cut-out portion and the center portion in a top view, and the center portion is thicker compared to the first portion and the second portion in a height direction.

13. The semiconductor module according to claim 12, wherein, the lead frame includes:

a circuit pattern connection portion connected to a circuit pattern, and a bridging portion configured to connect the chip connection portion and the circuit pattern connection portion, wherein the bridging portion is connected to one of the first portion and the second portion.

14. The semiconductor module according to claim 1, wherein an end of the center portion facing the first cut-out portion has an inclination with respect to a direction perpendicular to an extending direction of the transverse protective film.

15. The semiconductor module according to claim 12, wherein the first portion includes an extending portion which extends in a height direction between the center portion and the first end side in a top view.

16. The semiconductor module according to claim 1, wherein the first cut-out portion has a tapered shape in a top view.

17. The semiconductor module according to claim 12, wherein the bonding member includes a fillet portion arranged to extend outside the chip connection portion in a top view, and a shortest distance between the transverse protective film and the first portion is longer than an extending length of the fillet portion in a top view.

18. The semiconductor module according to claim 17, wherein, the shortest distance between the transverse protective film and the first portion is 0.5 mm or longer.

19. The semiconductor module according to claim 17, wherein the semiconductor chip further includes a peripheral protective film surrounding the active portion and connecting to the transverse protective film, and the shortest distance between the peripheral protective film and the first portion is longer than the extending length of the fillet portion in a top view.

20. The semiconductor module according to claim 11, wherein the semiconductor chip includes a plurality of the transverse protective film, and a cut-out portion is provided only on an end side of the chip connection portion facing the first pad region or the second pad region.

* * * * *